(12) United States Patent
Bruning

(10) Patent No.: US 6,617,795 B2
(45) Date of Patent: Sep. 9, 2003

(54) MULTICHIP LED PACKAGE WITH IN-PACKAGE QUANTITATIVE AND SPECTRAL SENSING CAPABILITY AND DIGITAL SIGNAL OUTPUT

(75) Inventor: Gert W. Bruning, Sleepy Hollow, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/915,700

(22) Filed: Jul. 26, 2001

(65) Prior Publication Data

US 2003/0020415 A1 Jan. 30, 2003

(51) Int. Cl.$^7$ ............................................. H05B 37/02
(52) U.S. Cl. ...................... 315/151; 315/158; 315/159; 315/169.3
(58) Field of Search ................... 315/149, 158, 159, 175, 169.3, 214, 224, 307, 151

(56) References Cited

U.S. PATENT DOCUMENTS

| | | | |
|---|---|---|---|
| 4,587,459 A | * | 5/1986 | Blake ........................ 315/158 |
| 4,804,890 A | | 2/1989 | Havel ........................ 315/169.3 |
| 5,136,483 A | | 8/1992 | Schoniger et al. ............. 362/61 |
| 5,783,909 A | * | 7/1998 | Hochstein .................... 315/159 |
| 5,803,579 A | | 9/1998 | Turnbull et al. ............. 362/83.1 |
| 6,441,558 B1 | * | 8/2002 | Muthu et al. ................. 315/149 |

FOREIGN PATENT DOCUMENTS

| | | | |
|---|---|---|---|
| DE | 19651140 | 12/1996 | ............. F21S/1/00 |
| DE | 29907454 | 4/1999 | ............. F21S/1/02 |
| JP | 11306824 | 11/1999 | ............. F21S/1/00 |
| WO | WO0019546 | 4/2000 | ............. H01L/33/00 |
| WO | WO0054655 | 9/2000 | ............. A61B/3/00 |

\* cited by examiner

*Primary Examiner*—Hoang Nguyen

(57) ABSTRACT

A multichip light-emitting-diode package having a support member, at least two light-emitting-diode chips disposed on the support member, at least one sensor disposed on the support member for reporting quantitative and spectral information to a controller, relating to the light output of the light-emitting-diodes, and a signal processing circuit, including an analog-to-digital converter logic circuit, disposed on the support member for converting the analog signal output produced by the sensors to a digital signal output.

16 Claims, 1 Drawing Sheet

MULTICHIP LED PACKAGE WITH IN-PACKAGE QUANTITATIVE AND SPECTRAL SENSING CAPABILITY AND DIGITAL SIGNAL OUTPUT

FIELD OF THE INVENTION

The present invention relates to multichip light-emitting-diode (LED) package, and more particularly, to a multichip LED package having a support member mounting two or more LED chips, one or more feedback sensors for measuring the quantitative and spectral characteristics of the LEDs' light output, and digital signal processing circuitry including an analog-to-digital converter logic circuit for providing a digital signal output from the sensor(s) to a controller external to the package that controls the lumen output and color components of the LEDs.

BACKGROUND OF THE INVENTION

Multichip LED packages have been used in the prior art as white light illuminating devices. For example, U.S. Pat. No. 5,136,483 to Schoniger et al. describes a white light illuminating device such as a headlamp, that employs red, green and blue LED'S that are used simultaneously and whose colors are complementary to each other to produce white light.

Another white light illuminating device is described in U.S. Pat. No. 5,803,579 to Turnbull, et al. The illuminating device in this patent includes a plurality of LEDs on a support member. When all of the LEDs are energized, illumination exhibiting a first perceived hue, e.g., blue-green, is projected from at least one of the LEDs and overlaps and mixes with illumination exhibiting a second perceived hue, e.g., amber, projected from at least one of the remaining LEDs. The overlapped and mixed illumination forms a white color.

A controller is usually used with these devices for at least "turning-on" and "turning-off" the LEDs. The light output and color of LEDs may also be adjustably controlled by the controller. This requires the use of some type of external optical sensor for sensing the lumen output and color (wavelength) of the device and providing this information to the controller.

The use of an external optical sensor undesirably increases the size and cost of the device. Moreover, there is no method for measuring the operating temperature of the LEDs in these existing devices. The operating temperature of the LEDs is important because changes in their operating temperature can effect the quantitative and spectral output of the LED, and therefore the device.

Accordingly, a multichip LED package is needed which substantially overcomes the disadvantages of the prior art multichip LED packages described above and provides further improvements in terms of cost, space, and manufacturing convenience.

SUMMARY OF THE INVENTION

A multichip light-emitting-diode package comprising a support member, at least two light-emitting-diode chips disposed on the support member, and at least one sensor disposed on the support member for reporting quantitative and spectral information to a controller relating to the light output of the light-emitting-diodes.

One aspect of the invention includes a signal processing circuit disposed on the support member for preparing the analog signal output produced by the sensors for digital processing by the controller.

Another aspect of the invention includes an analog-to-digital converter logic circuit which is provided in the signal processing circuit mentioned above, for converting the analog signal output produced by the sensors to a digital signal output.

BRIEF DESCRIPTION OF THE DRAWING

The advantages, nature, and various additional features of the invention will appear more fully upon consideration of the illustrative embodiments now to be described in detail in connection with accompanying drawing which is a perspective view of a multichip LED package according to an exemplary embodiment of the present invention.

DETAILED DESCRIPTION OF THE INVENTION

Figure 1:
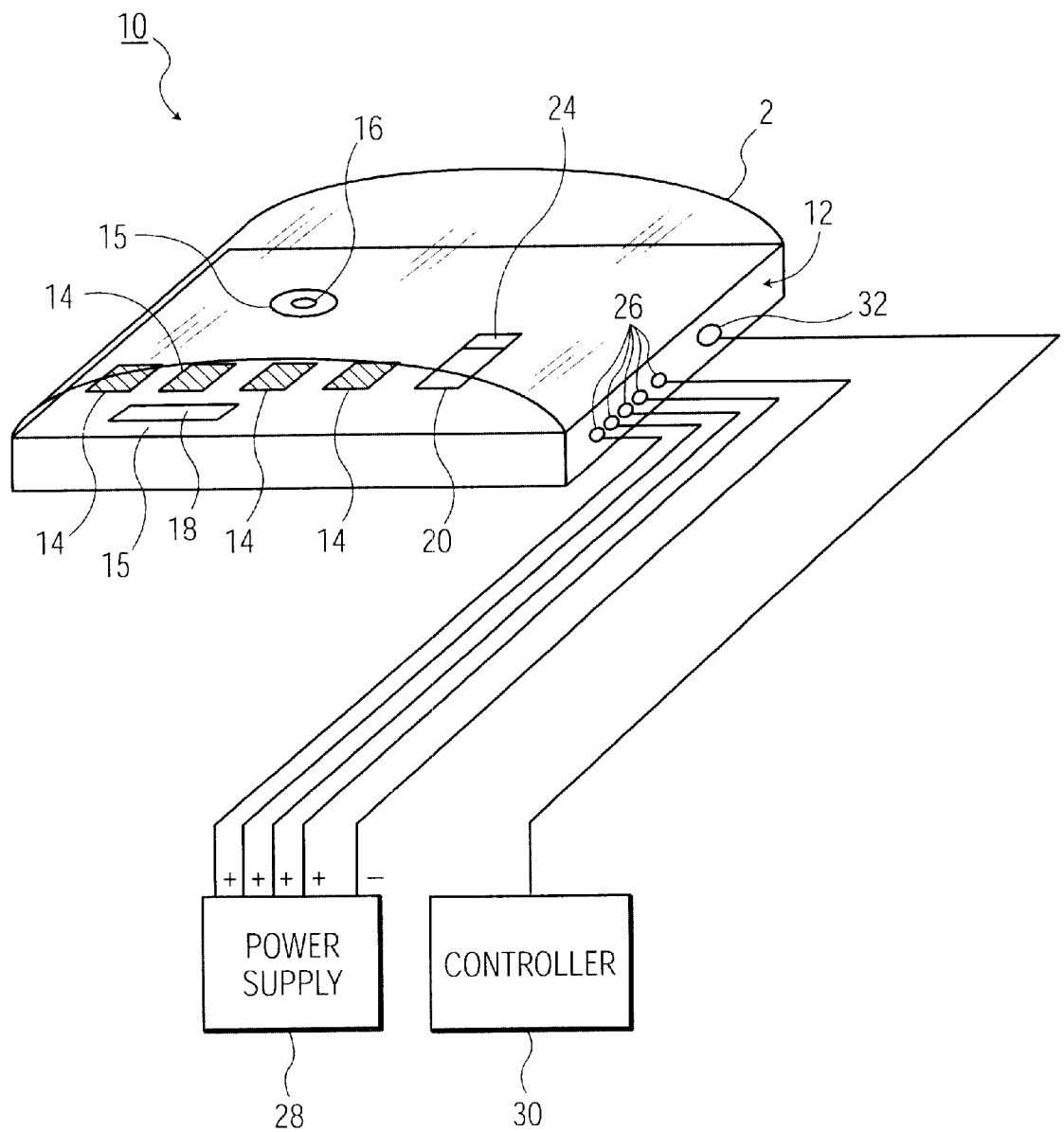

The drawing shows a multichip LED package 10 according to an exemplary embodiment of the present invention. The multichip LED package 10 includes a support member 12 which mounts two or more LED chips or "die" 14 (four are shown), at least one feedback sensor 15 for reporting quantitative and spectral information to a controller 30 external to the package 10, and a signal processing circuit 20 for preparing the signals generated by the one or more sensors 15 for digital processing by the controller 30. Optics 22 may be mounted over the LED chips 14, sensors 16, 18 and the signal processing circuit 20, on the support member 12 for optically manipulating the light produced by the package 10.

The support member 12 is a thermally conductive element that includes plus and minus power supply ports 26 for coupling the LED chips 14 to an external power supply 28 (a plus port may be provided for each LED chip 14 as shown in the drawing so that the power supplied to each chip 14 can be individually adjusted), and at least one digital signal input/output (I/O) port 32 for coupling the at least one feedback sensor 15 and the signal processing circuit 20 to the external controller 30. In another embodiment of the invention, the digital signal I/O port 32 may be replaced by two digital ports (not shown), i.e., one input port and one output port. In an exemplary embodiment of the present invention, the support member 12 may comprise a printed circuit board, ceramic substrate, housing or other structure capable of supporting the individual LED chips while simultaneously electrically connecting the LED chips to the power supply ports, electrically connecting the one or more sensors to the signal processing circuit and connecting the signal processing circuit to the digital signal ports.

The LED chips 14 used in the package 10 may include any group of useful LED colors and any useful number of LED chips, which enable the multichip LED package 10 to be operated to produce white or other colors of light. For purposes of illustration and not limitation, the LED chips 14 used in multichip LED packages especially intended for producing white light may comprise conventional green, red, and blue LED chips that respectively emit green, red, and blue light. Any number of LED chips may be used to optimize the quality of the white light generated by the package 10. For example, the LED chips 14 may include one red LED chip, two green LED chips, and one blue LED chip.

The one or more feedback sensors 15 may comprise one or more optical sensors, one or more thermal sensors, and preferably, a combination of at least one optical sensor 16 and at least one thermal sensor 18 as shown in the drawing.

The optical sensor 16 reports the output of the LEDs 14 in quantitative (light intensity) and spectral (wavelength) terms, to the external controller 30. Placement of the optical sensor within the package reduces the size and cost of light source LED modules which may employ the multichip LED package(s) 10 of the present invention. For purposes of illustration and not limitation, the optical sensor may comprise a conventional photosensor such as photodiode.

The thermal sensor 18 may comprise a semiconductor diode junction, a band gap reference circuit or any other thermal sensing element used in the integrated circuit art. The thermal sensor 18 reports the quantitative and spectral output of the LEDs 14 to the external controller 30 by measuring the temperature of the support member 12, which in turn can be correlated to the operating temperature of the LED chips 14. Operating temperature changes of the LED chips 14 effect their quantitative and spectral output. Thus, the quantitative and spectral output of the LED chips 14 can be held constant in the event of changes in the operating temperature of the chips 14, via corrective action reported by the thermal sensor 18 to the controller, which in turn adjusts the power supply current to the LEDs 14.

The thermal sensor 18 may also be used as a safety protection device. By way of example and not limitation, the thermal sensor 18 may be used to protect the LEDs 14 from overheating and sustaining damage.

The signal processing circuit 20 prepares the relatively low voltage analog signal outputs produced by the one or more sensors 15 (optical and thermal sensors 16 and 18) for digital processing by scaling them up and coding them for digital conversion. Providing the A/D converter logic circuitry "within the package" advantageously reduces component duplication within the package, and cost and space requirements of the package. The signal processing circuit 20 may be implemented in analog or digital form, and preferably includes an analog-to-digital (A/D) converter logic circuit 24 for converting the scaled-up and coded analog signal outputs of the one or more sensors 15 to digital signal outputs. Since many variations of these circuits are well known in the art, a detailed discussion of the structure and function of these circuits is unnecessary and therefore, not provided herein.

The optics 22 may include one or more optical elements for optically manipulating the light produce by the multichip LED package 10. For example, the optics 22 may include a collimator which focuses and/or shapes the light produced by the LED chips 14 of the package 10. Such optical elements are well known in the art and can be manufactured conventionally from plastic or glass.

While the foregoing invention has been described with reference to the above embodiments, various modifications and changes can be made without departing from the spirit of the invention. By way of example and not limitation, the thermal sensor 18 may be incorporated in the signal processing circuit 20. Moreover, a thermal sensor 18 may be provided for each LED chip 14. These and any other such modifications and changes are considered to be within the scope of the appended claims.

What is claimed is:

1. A multichip light-emitting-diode package comprising:
   a thermally-conductive support member;
   at least two light-emitting-diode chips disposed on the support member;
   at least one sensor thermally-coupled to the support member for sensing heat in the support member and, in response reporting information to a controller, the information pertaining to the light output of the light-emitting-diodes.

2. The multichip light-emitting-diode package according to claim 1, wherein the at least one sensor includes an optical feedback sensor.

3. A multichip light-emitting-diode package comprising:
   a support member;
   at least two light-emitting-diode chips disposed on the support member;
   at least one sensor disposed on the support member for reporting information to a controller and including an optical feedback sensor, the information pertaining to the light output of the light-emitting-diodes; and
   a thermal feedback sensor.

4. The multichip light-emitting-diode package according to claim 1, wherein the at least one sensor includes a thermal feedback sensor.

5. A multichip light-emitting-diode package comprising:
   a support member;
   at least two light-emitting-diode chip disposed on the support member;
   at least one sensor which produces an analog signal output disposed on the support member for reporting information to a controller, the information pertaining to the light output of the light-emitting-diodes; and
   a signal processing circuit disposed on the support member for converting the analog signal output produced by the at least one sensor to a digital signal output.

6. The multichip light-emitting-diode package according to claim 5, wherein the signal processing circuit includes an analog-to-digital converter logic circuit.

7. The A multichip light-emitting-diode package comprising:
   a support member;
   at least two light-emitting-diode chips disposed on the support member;
   at least one sensor disposed on the support member for reporting information to a controller, the information pertaining to the light output of the light-emitting-diodes; and
   at least one digital signal port for electrically connecting the output of the at least one sensor to the controller.

8. A multichip light-emitting-diode package comprising:
   a support member;
   at least two light-emitting-diode chips disposed on the support member;
   at least one sensor disposed on the support member for reporting information to a controller, the information pertaining to the light output of the light-emitting-diodes; and
   optics for manipulating the light output of the light-emitting-diodes.

9. A light generator comprising:
   at least one multichip light-emitting-diode package including:
   a thermally-conductive support member;
   at least two light-emitting-diode chips disposed on the support member; and
   at least one sensor thermally-coupled to the support member for sensing heat in the support member and, in response, reporting information to a controller, the information pertaining to the light output of the light-emitting-diodes.

10. The light generator according to claim 9, wherein the at least one sensor includes an optical feedback sensor.

11. A light generator comprising:
at least one multichip light-emitting-diode package including:
a support member;
at least two light-emitting-diode chips disposed on the support member; and
at least one sensor disposed on the support member for report information to a controller the information pertaining to the light output of the light-emitting-diodes; and
a thermal feedback sensor.

12. The light generator according to claim 9, wherein the at least one sensor includes a thermal feedback sensor.

13. A light generator comprising:
at least one multichip light-emitting-diode package including:
a support member;
at least two light-emitting-diode chips disposed on the support member; and
at least one sensor which produces an analog signal output disposed on the support member for reporting information to a controller, the information pertaining to the light output of the light-emitting-diodes; and
a signal processing circuit disposed on the support member for convening the analog signal output produced by the at least one sensor to a digital signal output.

14. The light generator according to claim 13, wherein the signal processing circuit includes an analog-to-digital converter logic circuit.

15. A light generator comprising:
at least one multichip light-emitting-diode package including:
a support member;
at least two light-emitting-diode chips disposed on the support member; and
at least one sensor disposed on the support member for reporting information to a control, the information pertaining to the light output of the light-emitting-diodes; and
optics For manipulating the light output of the light-emitting-diode.

16. A light generator comprising:
at least one multichip light-emitting-diode package including:
a support member:
at least two light-emitting-diode chips disposed on the support member: and at least one sensor disposed on the support member for reporting information to a controller, the information pertaining to the halt output of the light-emitting-diodes; and
at least one digital signal port for electrically connecting the output of the at least one sensor to the controller.

* * * * *